(12) United States Patent
Chen et al.

(10) Patent No.: US 11,171,046 B2
(45) Date of Patent: Nov. 9, 2021

(54) METHODS FOR FORMING COBALT AND RUTHENIUM CAPPING LAYERS FOR INTERCONNECT STRUCTURES

(71) Applicant: APPLIED MATERIALS, INC., Santa Clara, CA (US)

(72) Inventors: Feng Chen, San Jose, CA (US); Yufei Hu, Santa Clara, CA (US); Wenjing Xu, Santa Clara, CA (US); Gang Shen, Santa Clara, CA (US); Zhiyuan Wu, San Jose, CA (US); Tae Hong Ha, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/837,365

(22) Filed: Apr. 1, 2020

(65) Prior Publication Data
US 2020/0321247 A1    Oct. 8, 2020

Related U.S. Application Data

(60) Provisional application No. 62/830,423, filed on Apr. 6, 2019.

(51) Int. Cl.
| H01L 21/768 | (2006.01) |
| H01L 23/532 | (2006.01) |
| H01L 21/285 | (2006.01) |
| H01L 23/522 | (2006.01) |

(52) U.S. Cl.
CPC .. *H01L 21/76852* (2013.01); *H01L 21/28568* (2013.01); *H01L 23/5226* (2013.01); *H01L 23/53238* (2013.01); *H01L 23/53266* (2013.01)

(58) Field of Classification Search
CPC ......... H01L 21/76852; H01L 23/53266; H01L 21/28568; H01L 23/5226; H01L 23/53238; H01L 21/28562; H01L 21/76843; H01L 21/76882; H01L 21/76849
See application file for complete search history.

(56) References Cited

U.S. PATENT DOCUMENTS

| 7,265,048 B2 * | 9/2007 | Chung ............. H01L 21/28556 438/628 |
| 9,677,172 B2 | 6/2017 | Ha et al. |
| 2005/0104216 A1 * | 5/2005 | Cabral, Jr. ........ H01L 23/53238 257/758 |
| 2018/0082957 A1 * | 3/2018 | Edelstein .......... H01L 21/76826 |

* cited by examiner

*Primary Examiner* — Robert G Bachner
(74) *Attorney, Agent, or Firm* — Moser Taboada

(57) ABSTRACT

Methods and apparatus for forming an interconnect structure, the method including selectively depositing two or more capping layers atop a top surface of a via within a low-k dielectric layer, wherein the two or more capping layers include a first layer of ruthenium and a second layer of cobalt.

16 Claims, 7 Drawing Sheets

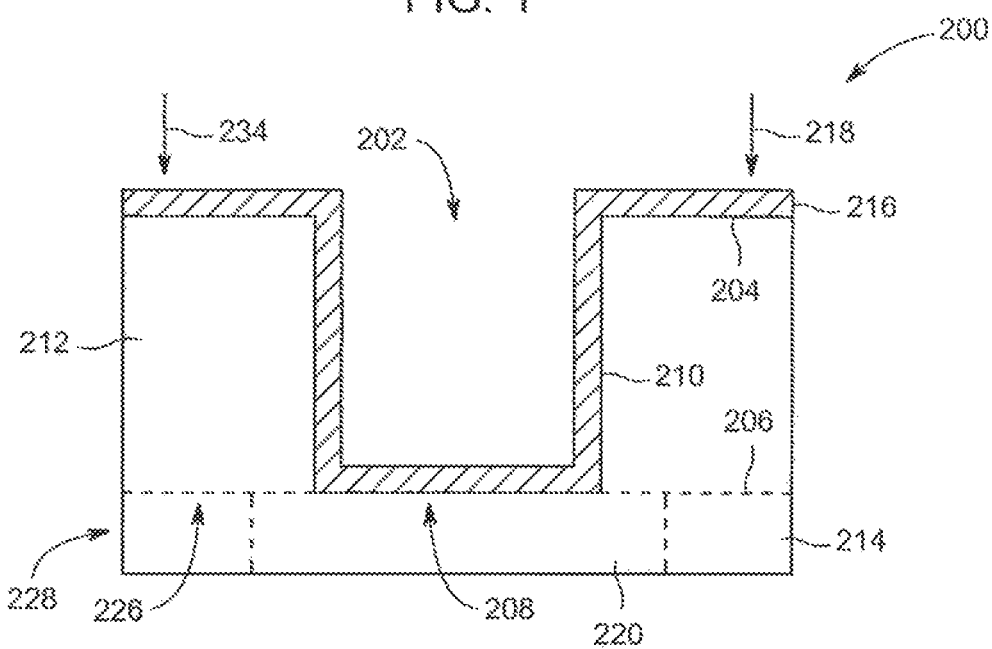
FIG. 1
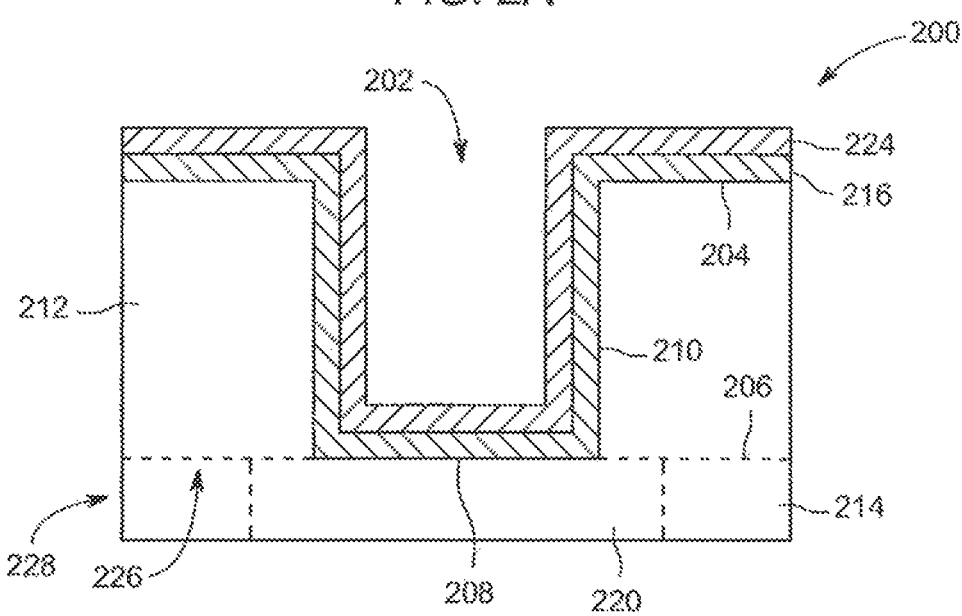
FIG. 2A
FIG. 2B

METHODS FOR FORMING COBALT AND RUTHENIUM CAPPING LAYERS FOR INTERCONNECT STRUCTURES

CROSS-REFERENCE TO RELATED APPLICATIONS

This application claims benefit of United States provisional patent application Ser. No. 62/830,423, filed Apr. 6, 2019 which is herein incorporated by reference in its entirety.

FIELD

Embodiments of the present disclosure generally relate to methods of processing substrates, and specifically to methods for forming cobalt and ruthenium capping layers for metal interconnect structures such as copper interconnect structures.

BACKGROUND

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Interconnects provide the electrical connections between the various electronic elements of an integrated circuit and form the connections between the circuit elements and the device's external contact elements, such as pins, for connecting the integrated circuit to other circuits. Typically, interconnect lines form horizontal connections between electronic circuit elements while conductive via plugs form vertical connections between the electronic circuit elements, resulting in layered connections.

Advances in semiconductor materials and processing techniques have resulted in reducing the overall size of the integrated circuit elements while increasing their number or density on a single body. However, the inventors have observed that, as device nodes get smaller (for example, approaching dimensions of about 22 nm or less), challenges present degrading electromigration lifetimes, and reducing device reliability. For example, copper is an excellent conductor and has been used in chips because copper components such as metal filled vias have excellent functionality at smaller sizes. However, copper problematically diffuses throughout its surroundings or along a weak interface, unless contained, for example in a liner and/or by a capping layer. The inventors have observed that the certain liners and capping layers are deficient and decrease the reliability of the interconnect device. For example, capping material and liner material may become mobile in current. The mobility or diffusion of the capping layer material has been linked to degraded electromigration lifetimes, such as where a cobalt cap is used alone with a ruthenium liner.

Additionally, the inventors have observed poor adhesion between known capping layers with an adjacent layer interface resulting in reduced device reliability. Thus, improved methods for forming capping layers for copper interconnect structures are needed.

SUMMARY

Methods and apparatus for forming an interconnect structure are provided herein. In some embodiments, an apparatus for forming an interconnect structure includes selectively depositing two or more capping layers atop a top surface of a via within a low-k dielectric layer, wherein the two or more capping layers include a first layer of ruthenium and a second layer of cobalt.

In some embodiments, the present disclosure relates to a method of selectively depositing at least two capping layers atop a substrate having a metal surface and a low-k dielectric surface, including: contacting the metal surface with one of ruthenium, cobalt, or combinations thereof to form a first capping layer atop the metal surface; and contacting a top surface of the first capping layer with one of ruthenium, cobalt, or combinations thereof to form a second capping layer atop the first capping layer, wherein the first capping layer and second capping layer include different material.

In some embodiments, the present disclosure relates to an interconnect structure, including: a metal filled via disposed within a low-k dielectric layer, wherein a top surface of the metal filled via is adjacent to a top surface of the low-k dielectric layer; a first capping layer deposited atop the top surface of the metal filled via; and a second capping layer deposited atop a top surface of the first capping layer, wherein the first capping layer and second capping layer include ruthenium, cobalt, and combinations thereof, and wherein the first capping layer and second capping layer are different.

In some embodiments, the present disclosure relates to a method of selectively depositing a capping layer atop a substrate having a metal surface and a low-k dielectric surface, including: contacting the metal surface with one of ruthenium, cobalt, or combinations thereof to form a first capping portion atop the metal surface; and contacting a top surface of the first capping portion with one of ruthenium, cobalt, or combinations thereof to form a second capping portion atop the first capping portion, wherein the first capping portion and second capping portion comprise different material.

In some embodiments, the present disclosure relates to an interconnect structure, including: a metal filled via disposed within a low-k dielectric layer, wherein a top surface of the metal filled via is adjacent to a top surface of the low-k dielectric layer; a capping layer including a first capping portion deposited atop the top surface of the metal filled via, and a second capping portion deposited atop a top surface of the first capping portion, wherein the first capping portion and second capping portion comprise ruthenium, cobalt, and combinations thereof, and wherein the first capping portion and second capping portion are different.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate typical embodiments of the disclosure and are therefore not to be considered limiting of scope, for the disclosure may admit to other equally effective embodiments.

FIG. 1 depicts a flow chart of a method for forming an interconnect structure in accordance with some embodiments of the present disclosure.

FIGS. 2A-2F depict side cross-sectional views of an interconnect structure formed in accordance with some embodiments of the present disclosure.

Figure 2C:
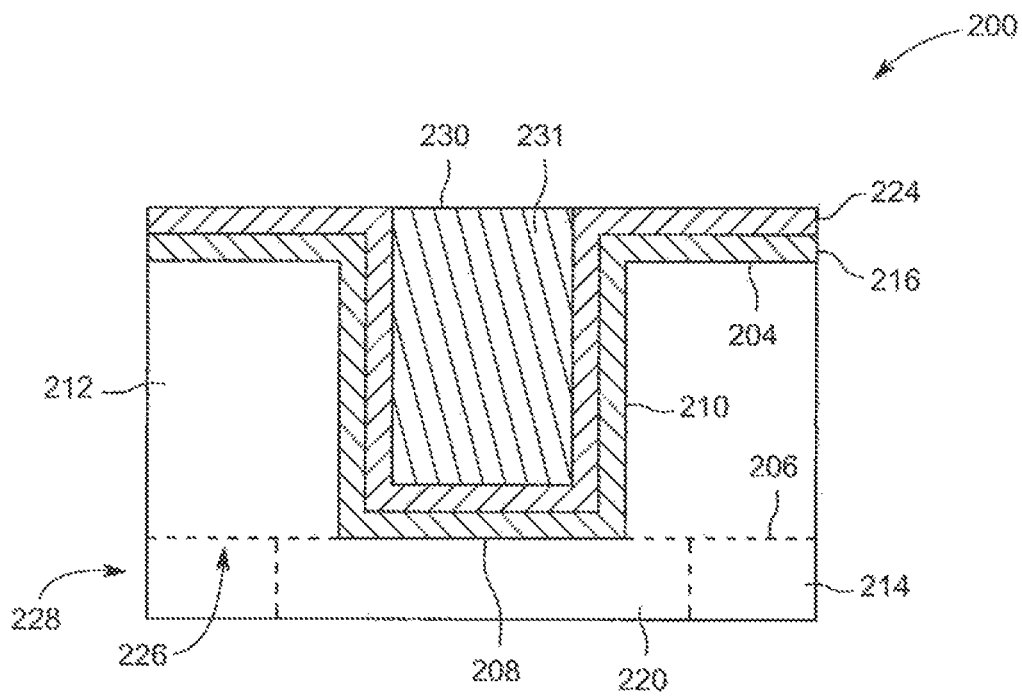

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for selectively forming cobalt and ruthenium capping layers for copper interconnect structures are provided herein. In embodiments, the present disclosure relates to methods of forming an interconnect structure, including selectively depositing two or more capping layers atop a top surface of a via within a low-k dielectric layer, wherein the two or more capping layers include a first layer of ruthenium and a second layer of cobalt. The cobalt and ruthenium capping layers advantageously facilitate improved copper interconnect interface adhesion and improved device properties such as electron migration and time dependent dielectric breakdown. The inventive methods may be utilized with any device nodes but may be particularly advantageous in device nodes of about 25 nm or less, for example about 3 nm to about 25 nm, such as 20 nm, 14 nm, 7 nm, 5 nm, or 3 nm.

FIG. 1 depicts a flow chart of a method 100 for forming cobalt and ruthenium capping layers in accordance with some embodiments of the present disclosure. The method 100 is described below with respect to an interconnect structure, as depicted in FIGS. 2A-2F. The method 100 may be performed in any suitable process chambers configured for one or more of chemical vapor deposition (CVD), physical vapor deposition (PVD), or atomic layer deposition (ALD). Exemplary processing systems that may be used to perform the inventive methods disclosed herein may include, but are not limited to, any of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including ones available from other manufacturers, may also be suitably used in connection with the teachings provided herein.

FIG. 2A depicts a substrate 200 having an opening 202 formed in a first surface 204 of the substrate 200 and extending into the substrate 200 towards an opposing second surface 206 of the substrate 200. The substrate 200 may be any suitable substrate having an opening 202 formed in the substrate. For example, the substrate 200 may comprise one or more of a dielectric material, silicon (Si), metals, or the like. In addition, the substrate 200 may include additional layers of materials or may have one or more completed or partially completed structures formed in, or on, the substrate 200. For example, the substrate 200 may include a first dielectric layer 212, such as silicon oxide, a low-k material (e.g., a material having a dielectric constant less than silicon oxide, or less than about 3.9), or the like. The opening 202 may be formed in the first dielectric layer 212. In some embodiments, the first dielectric layer 212 may be disposed atop a second dielectric layer 214, such as silicon oxide, silicon nitride, silicon carbide, or the like. A first conductive material (e.g., conductive material 220) may be disposed in the second dielectric layer 214 and may be aligned with the opening 202 such that the opening, when filled with a second conductive material, provides an electrical path to and from the first conductive material.

The opening 202 may be any opening, such as a via, trench, dual damascene structure, or the like. In some embodiments, the opening 202 may have a height to width aspect ratio of about 4:1 or more (e.g., a high aspect ratio). The opening 202 may be formed by etching the substrate 200 using any suitable etch process. The opening 202 includes a bottom surface 208 and sidewalls 210.

In some embodiments, the substrate 200 may be covered with one or more layers prior to depositing the cobalt and ruthenium capping layers as described below. For example, the sidewalls 210 of the opening 202, the bottom surface 208 of the opening, and the first surface 204 of the substrate 200 may be covered by a barrier layer 216. The barrier layer 216 may serve to prevent diffusion of a subsequently deposited metal layer into underlying layers, such as first dielectric layer 212. The barrier layer 216 may include any material suitable to act as a barrier. For example, in some embodiments, the barrier layer 216 may include a metal, for example, titanium (Ti), tantalum (Ta), cobalt (Co), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The barrier layer 216 may have any thickness suitable to prevent the diffusion of subsequently deposited metal layer materials into underlying layers. For example, in some embodiments, the barrier layer 216 layer may have a thickness of about 10 to about 50 angstroms. The barrier layer 216 may be formed by any process suitable to provide the barrier layer 216 having a suitable thickness. For example, in some embodiments, the barrier layer 216 may be formed via a deposition process, such as chemical vapor deposition, physical vapor deposition, or a cyclical deposition process, for example, such as atomic layer deposition, or the like.

In some embodiments, and as illustrated by dotted lines in FIG. 2A, the opening 202 may extend completely through the substrate 200 and an upper surface 226 of a second substrate 228 and may form the bottom surface 208 of the opening 202. The second substrate 228 may be disposed adjacent to the second surface 206 of the substrate 200. Further (and also illustrated by dotted lines), a first conductive material (e.g., conductive material 220), for example as part of a device, such as a logic device or the like, or an electrical path to a device requiring electrical connectivity, such as a gate, a contact pad, a conductive line or via, or the like, may be disposed in the upper surface 226 of the second substrate 228 and aligned with the opening 202. In some embodiments, the first conductive material (e.g., 220) aligned with the opening 202 may include copper.

In some embodiments, the substrate 200 may include a liner 224 disposed atop the barrier layer 216. The liner 224 may be formed by any process suitable to provide the liner 224 having a suitable thickness. For example, in some embodiments, the liner 224 may be formed via a deposition process, such as chemical vapor deposition, physical vapor deposition, or a cyclical deposition process, for example, such as atomic layer deposition, or the like. In embodiments, the liner 224 may have a thickness of about 10 to about 50 angstroms.

In some embodiments, the barrier layer 216 is exposed to a cobalt precursor 218 and/or to a ruthenium precursor 234 to form a liner 224 such as a cobalt liner, ruthenium liner or cobalt-ruthenium liner on the barrier layer 216 disposed upon the sidewalls 210 and the bottom surface 208 of the opening 202. Optionally, liner 224 may be disposed directly atop first surface 204 of the substrate 200 and on the sidewalls 210 and the bottom surface 208 of the opening 202. In some embodiments, the substrate 200 may be heated prior to depositing the liner 224. In embodiments, the liner 224 is deposited to a thickness of about 10 to 100 angstroms. In embodiments, the liner 224 is conformally deposited to cover the sidewalls and bottom surface of the via, without filling the via. In some embodiments, the liner is deposited according to methods described in U.S. Pat. No. 9,677,172 entitled Methods for Forming a Cobalt-Ruthenium Liner Layer for Interconnect Structures to Applied Materials, Inc.

In embodiments, as depicted in FIG. 2C, following formation of the liner 224 such as a cobalt liner, ruthenium liner, or cobalt-ruthenium liner, a conductive material such as second conductive material 230 may be deposited on the liner 224. For example, the second conductive material 230 may be deposited on the sidewalls 210 and the bottom surface 208 of the feature, to form a conductive layer. In some embodiments, the conductive material is deposited atop the upper surface of the substrate. In some embodiments, the second conductive material 230 may be deposited by a physical vapor deposition process. In embodiments, the second conductive material 230 may include metals, metal alloys, or the like, such as one or more of copper (Cu), aluminum (Al), tungsten (W), or the like. In some embodiments, the second conductive material 230 is copper.

In some embodiments, a conductive layer of second conductive material 230 may be heated, or annealed, to draw the deposited material into the opening 202 (for example, via capillary action). The heating process may be performed at a temperature ranging from about 150 to about 400 degrees Celsius. In some embodiments, the liner 224 allows for the second conductive material 230 to re-flow into, and fill, the opening without forming a void in the opening. Upon completion of the heating process, the bottom surface 208 of the opening 202 may be covered with deposited material. In some embodiments, the process of depositing the second conductive material 230 of a conductive layer and annealing the deposited second conductive material may be repeated to fill the opening 202. Alternatively, after filling a portion of the opening 202 is filled as described above, the remainder of the opening 202 may be filled using an electrochemical deposition process. Further, when the opening 202 has been filled by the second conductive material 230, the opening 202 may be filled above the level of the upper surface of the substrate or top surface of the a dielectric layer such as a low-dielectric layer and/or deposited material, for example from the second conductive material 230, may remain on the upper surface of the substrate 200. Accordingly, techniques, such as wet clean in an acidic solution, chemical or electrochemical mechanical polishing, or the like may be used to remove excess deposited material from the upper surface above opening 202.

Figure 2D:
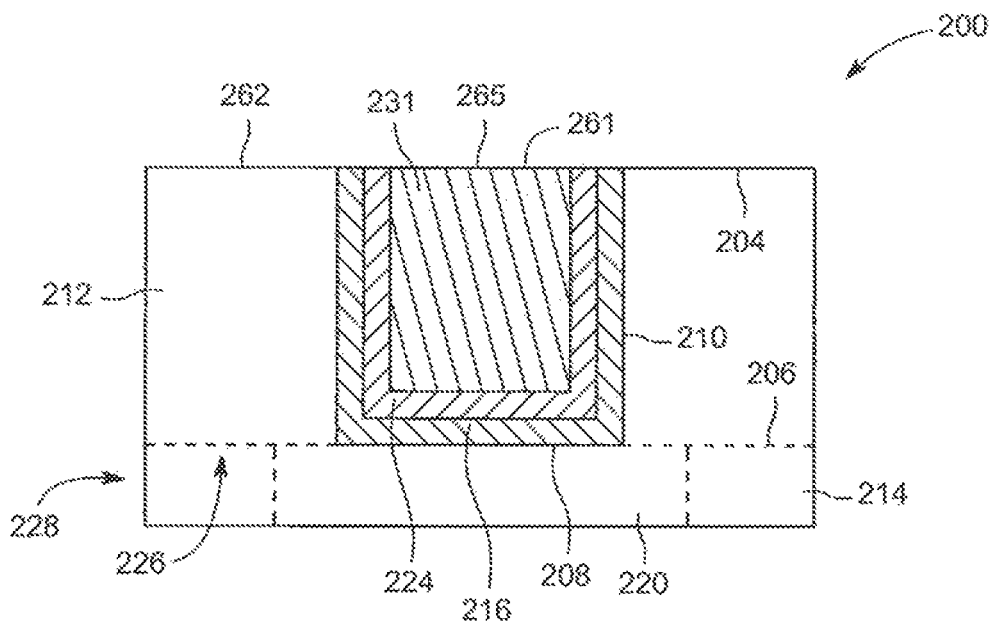

In embodiments, as depicted in FIG. 2D, following formation of a via 231 (FIG. 2C) filled with a conductive material such as second conductive material 230, the device may be subjected to polishing and planarization to remove layers deposited atop first surface 204. For example a chemical mechanical planarization (CMP) method may be used to form a structure as shown in FIG. 2D with an exposed metal surface such as metal surface 261 which is, in embodiments, a top surface of a via 231 within a low-k dielectric layer including exposed dielectric layer field such as dielectric surface 262 comprised or consisting of a low-k material. In embodiments, metal surface 261 is equivalent to dielectric surface 262, for example, metal surface 261 and dielectric surface 262 form a continuous layer or continuous top surface of substrate 200. In embodiments, metal surface 261 is a top surface 265 of a via 231, wherein via 231 is formed within a low-k material such as first dielectric layer 212.

Figure 2E:
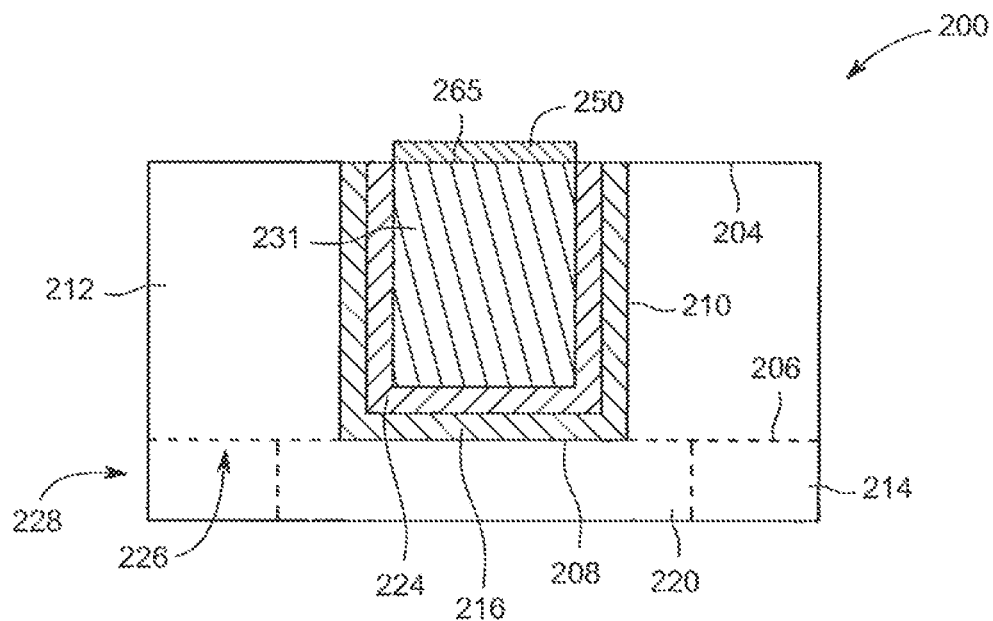
Figure 2F:
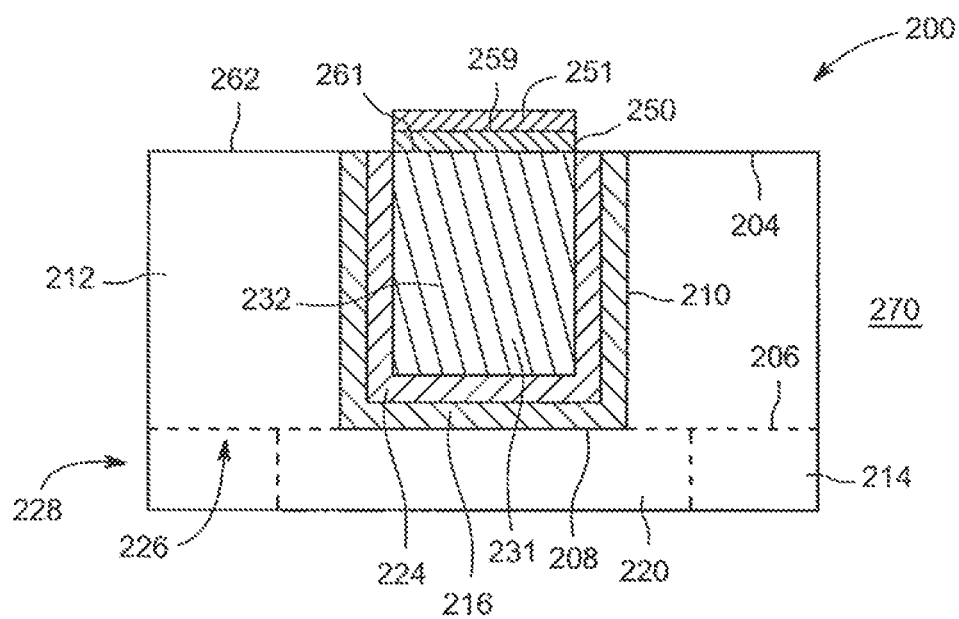

Referring now to FIG. 1, at process sequence 102, and FIGS. 2E and 2F, method 100 may begin by selectively depositing two or more capping layers (such as first capping layer 250 and second capping layer 251) atop a top surface 265 of a via 231. In embodiments, via 231 is disposed within a low-k dielectric layer such as first dielectric layer 212 and filled with a conductive material such as second conductive material 230. In embodiments, the second conductive material 230 is copper. In embodiments, two or more capping layers (such as first capping layer 250 and second capping layer 251) include a first layer of ruthenium as the first capping layer 250 and a second layer of cobalt as the second capping layer 251. In embodiments, the first capping layer 250 is deposited directly atop metal surface 261. In embodiments, the first capping layer 250 is selectively deposited directly atop metal surface 261 and does not form or deposit atop dielectric surface 262. In embodiments, the second capping layer 251 is deposited directly atop the first capping layer 250. In embodiments, the second capping layer 251 is selectively deposited directly atop first capping layer 250 and does not form or deposit atop dielectric surface 262. In embodiments, the first capping layer 250 is cobalt, ruthenium, or combinations thereof. In embodiments, the second capping layer 251 is cobalt, ruthenium, or combinations thereof. In embodiments, the first capping layer 250 and second capping layer 251 are one of cobalt, ruthenium, or combinations thereof, wherein the material of the first capping layer 250 and second capping layer 251 are different. For example, in embodiments, the first capping layer 250 is cobalt, and second capping layer 251 is ruthenium, and in embodiments, the first capping layer 250 is ruthenium, and second capping layer 251 is cobalt. In embodiments, first capping layer 250 is an alloy of cobalt and ruthenium, and the second capping layer 251 is an alloy of cobalt and ruthenium, wherein the ratio of cobalt to ruthenium is different in the first capping layer 250 and second capping layer 251.

In some embodiments, the top surface 265 of via 231 such as metal surface 261, may be a copper surface of a copper filled via. In embodiments, the first capping layer 250 may be cobalt and formed by contacting top surface 265 of via 231 with a cobalt precursor, such as cobalt precursor to form at least one of the two or more capping layers, for example at a flow rate of about 10 sccm to about 1000 sccm. In embodiments, the first capping layer 250 may be cobalt selectively formed by contacting top surface 265 of via 231 with a cobalt precursor. In some embodiments, suitable non-limiting examples of cobalt precursors may include one or more of cobalt carbonyl complexes, cobalt amidinate compounds, cobaltocene compounds, cobalt dienyl complexes, cobalt nitrosyl complexes, derivatives thereof, complexes thereof, plasmas thereof, or combinations thereof. In some embodiments, dicobalt hexacarbonyl acetyl compounds may be used to form one of the two or more capping layers such as first capping layer 250. Dicobalt hexacarbonyl acetyl compounds may have the chemical formula of $(CO)_6CO_2(RC\equiv CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6CO_2(HC\equiv C^tBu)$) is the cobalt precursor. Other examples of dicobalt hexacarbonyl acetyl compounds include dicobalt hexacarbonyl methylbutylacetylene $((CO)_6CO_2(MeC\equiv C^tBu))$, dicobalt hexacarbonyl phenylacetylene $((CO)_6CO_2(HC\equiv CPh))$, hexacarbonyl methylphenylacetylene $((CO)_6CO_2(MeC\equiv CPh))$, dicobalt hexacarbonyl methylacetylene $((CO)_6CO_2(HC\equiv CMe))$, dicobalt hexacarbonyl dimethylacetylene $((CO)_6CO_2(MeC\equiv CMe))$, derivatives thereof, complexes thereof, or combinations thereof. Other exemplary cobalt carbonyl complexes include cyclopentadienyl cobalt bis(carbonyl) $(CpCo(CO)_2)$, tricarbonyl allyl cobalt $((CO)_3Co(CH_2CH=CH_2))$, or derivatives thereof, complexes thereof, or combinations thereof. In embodiments, the precursors described herein are suitable form forming a second capping layer 251, wherein the second capping layer 251 is cobalt deposited atop, or selectively atop a first capping layer 250, for example, where the first capping layer 250 is made of a different material such as ruthenium. In embodiments, first capping layer 250 may be cobalt and formed by contacting top surface 265 of via 231 with a cobalt precursor, such as cobalt precursor to form one of the two or more capping layers, without forming cobalt on the dielectric surface 262.

In some embodiments, the top surface of a via, such as metal surface 261, may be a copper surface of a copper filled via exposed to a ruthenium precursor to form one of the two or more capping layers, for example at a flow rate of about 10 sccm to about 1000 sccm. In embodiments, the first capping layer 250 may be ruthenium and formed by contacting top surface 265 of via 231 with a ruthenium precursor, such as ruthenium precursor 234 to form one of the two or more capping layers, for example at a flow rate of about 750 sccm to about 1000 sccm. In some embodiments, suitable ruthenium precursors to form one of the two or more capping layers may include one or more of methyl-cyclohexadine ruthenium tricarbonylcyclohexadine, ruthenium tricarbonyl, butadiene ruthenium tricarbonyl, dimethyl butadiene ruthenium tricarbonyl, or modified dines with $Ru(CO)_3$. In embodiments, the precursors described herein are suitable form forming a second capping layer 251, wherein the second capping layer 251 is ruthenium deposited atop, or selectively atop a first capping layer 250, for example, where the first capping layer 250 is made of a different material such as cobalt.

In some embodiments, the method to forming an interconnect structure including two or more capping layers atop the top surface of a via may further include flowing a reactant gas, such as hydrogen $(H_2)$, along with the precursor gases. General processing conditions for forming capping layers discussed above include maintaining process chamber pressure at about 1 to about 30 Torr.

In some embodiments, the two or more capping layers such as first capping layer 250 and second capping layer 251 shown in FIGS. 2E-2F may be formed via a plasma assisted deposition process, such as a plasma enhanced chemical vapor deposition process, or a thermal chemical vapor deposition process. In some embodiments, for example, the substrate 200 and the top surface of a metal filled via may be exposed to the cobalt precursor and/or the ruthenium precursor in a plasma state. The plasma may be formed by coupling sufficient energy, for example radio frequency (RF) energy from a power source to ignite the cobalt and ruthenium precursors to form the plasma. In some embodiments, the power source may illustratively provide about 400 watts, of power at a suitable frequency, such as about 13.56 MHz. In embodiments, plasma facilitates a decomposition of the precursors, causing a deposition of material on the substrate 200 selectively, to form capping layers atop metal surface 261 or one another, and not atop the first dielectric layer 212 or a low-k dielectric layer field.

In some embodiments, first capping layer 250 and second capping layer 251 may be formed by exposing the substrate 200 sequentially to the cobalt precursor and then to the ruthenium precursor, and vice versa. In such embodiments, the composition of the first capping layer 250 and second capping layer 251 can be adjusted by adjusting the process time the substrate 200 is exposed to each precursor. For example, in some embodiments, the substrate 200 may be exposed to the cobalt precursor for a first period of time to form a cobalt layer as first capping layer 250 or second capping layer 251 to a suitable thickness. In some embodiments, the substrate 200 may be exposed to the ruthenium precursor for a first period of time to form a ruthenium layer as first capping layer 250 or second capping layer 251 to a suitable thickness.

As depicted in FIG. 2F, the substrate 200 is subsequently exposed to a second precursor for a second period of time, subsequent to the first period of time, to form a second capping layer 251 atop the first capping layer 250. In embodiments, the second capping layer 251 is deposited to a thickness suitable for retaining the second conductive materials within the via 231. In embodiments, the second capping layer 251 has a thickness of about 10 angstroms to about 15 angstroms. In some embodiments, the substrate 200 and first capping layer 250 is subsequently exposed to a second precursor suitable for forming ruthenium for a second period of time, subsequent to the first period of time, to form a ruthenium capping layer such as second capping layer 251 atop a cobalt capping layer or first capping layer 250. In embodiments, ruthenium is deposited atop a first cobalt capping layer to form a ruthenium capping layer directly atop a first cobalt capping layer, wherein the first cobalt capping layer is directly atop the top metal surface of a metal filled via. In embodiments, ruthenium precursor is deposited for a period of time sufficient to form a ruthenium layer for second capping layer 251 to a thickness of about 5 angstroms to about 10 angstroms. In some embodiments, the process chamber is purged of cobalt precursor 218 prior to exposing the substrate 200 to the ruthenium precursor 234. In some embodiments, a reactant gas, as described above, may be provided along with at least one of the cobalt precursor or ruthenium precursor to form the first capping layer 250 or second capping layer 251.

In some embodiments, in order to form the first capping layer 250 and second capping layer 251, the substrate 200 including a dielectric layer surface and metal surface may be exposed simultaneously to a ruthenium precursor and the cobalt precursor to deposit two or more cobalt-ruthenium capping layers to a suitable thickness, such as the thickness range recited above. In embodiments where the substrate is simultaneously exposed to the cobalt precursor and the ruthenium precursor, the composition of the first capping layer and second capping layer may include cobalt-ruthenium and can be adjusted to form first and second capping layers of different material compositions by adjusting the flow ratio of the precursors. For example, in some embodiments, the first capping layer is a cobalt-ruthenium layer including less than about 50 percent ruthenium, with the balance being cobalt, and the second capping layer is a cobalt-ruthenium layer including less than about 50 percent cobalt, with the balance being ruthenium. In some embodiments, the ratio of cobalt precursor to ruthenium precursor provided to the processing chamber is about 2:1 to about 4:1.

In some embodiments, the first capping layer is a cobalt-ruthenium layer as a single layer having a uniform or non-uniform composition through a thickness of the cobalt-ruthenium layer. For example, in some embodiments, the first capping layer 250 is a cobalt-ruthenium layer including a cobalt layer material and a ruthenium layer material, wherein the ruthenium layer material is deposited throughout the thickness of the cobalt-ruthenium layer. In some embodiments, the second capping layer is a cobalt-ruthenium layer as a single layer having a uniform or non-uniform composition through a thickness of the cobalt-ruthenium layer. For example, in some embodiments, the second capping layer is a cobalt-ruthenium layer including a cobalt layer material and a ruthenium layer material, wherein the ruthenium layer material is deposited throughout the thickness of the cobalt-ruthenium layer.

Referring to FIG. 1 and FIG. 2F, in some embodiments, the present disclosure relates to a method of forming an interconnect structure 270. In embodiments, the method includes selectively depositing two or more capping layers (such as first capping layer 250 and second capping layer 251) atop a top surface such as metal surface 261 of a via 231 within a first dielectric layer 212 such as a low-k dielectric. In embodiments, the two or more capping layers (such as first capping layer 250 and second capping layer 251) include a first layer of ruthenium and a second layer of cobalt. In embodiments, the two or more capping layers (such as first capping layer 250 and second capping layer 251) include a first layer of cobalt and a second layer of ruthenium. In some embodiments, a via 231 includes a copper metal fill material 232. In some embodiments, the via 231 includes a copper metal fill material 232 deposited atop a liner 224. In some embodiments, the via 231 includes a copper metal fill material 232 deposited atop a liner 224, wherein the liner 224 includes ruthenium, cobalt, and combinations thereof. In some embodiments, the via 231 includes a copper metal fill material 232 deposited atop a liner 224 or liner layer, and wherein the liner layer or liner 224 is deposited atop a barrier layer 216. In some embodiments, the two or more capping layers (such as first capping layer 250 and second capping layer 251) each have a thickness of 5 to 20 angstroms. In some embodiments, the first capping layer 250 is a layer of ruthenium disposed directly atop the top surface 265 of a via 231 within a low-k dielectric layer, and the second capping layer 251 is a layer of cobalt deposited or disposed directly atop a top surface 259 of the first capping layer 250 of ruthenium. In some embodiments, a second layer of cobalt is deposited or disposed directly atop the top surface 265 of a via 231 within a low-k dielectric layer, and a first layer of ruthenium is directly atop a top layer of the second layer of cobalt.

Figure 3:
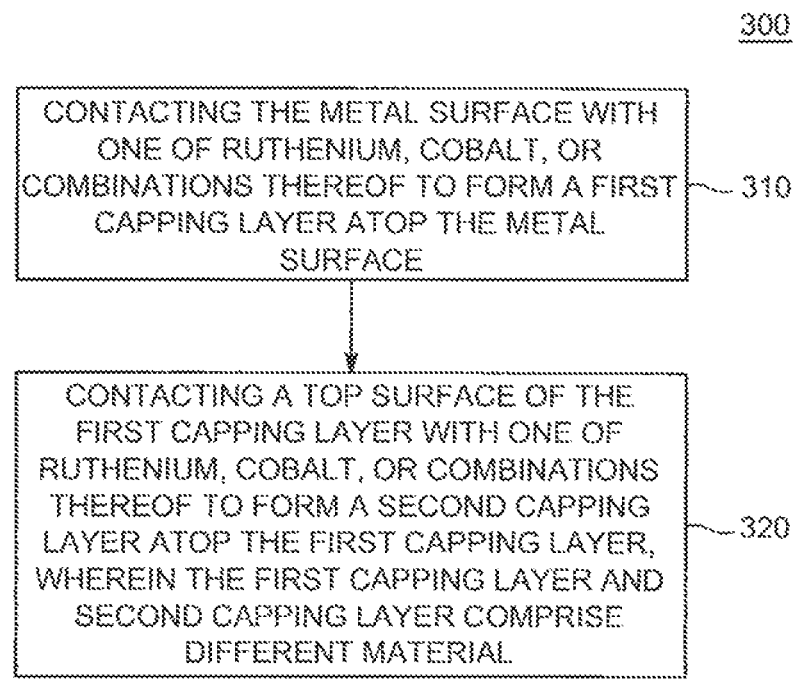
FIG. 3 depicts a flow chart of a method for forming an interconnect structure in accordance with some embodiments of the present disclosure.

Referring now to FIG. 3, in some embodiments, the present disclosure includes a method of selectively depositing at least two capping layers (such as first capping layer 250 and second capping layer 251) atop a substrate having a metal surface and a low-k dielectric surface. At process sequence the 310, process 300 includes contacting the metal surface with one of ruthenium, cobalt, or combinations thereof to form a first capping layer atop the metal surface. At process sequence 320 the process includes contacting a top surface of the first capping layer with one of ruthenium, cobalt, or combinations thereof to form a second capping layer atop the first capping layer, wherein the first capping layer and second capping layer comprise different material. In some embodiments, the method includes wherein the low-k dielectric layer inhibits the deposition of ruthenium, cobalt, or combinations thereof thereon. In some embodiments, the metal surface is the top surface of a copper filled via. In some embodiments, the copper filled via comprises a liner layer, wherein the liner layer comprises ruthenium, cobalt, and combinations thereof. In some embodiments, the two or more capping layers each have a thickness of 5 to 20 angstroms. In some embodiments, the first capping layer comprises ruthenium and the second capping layer comprises cobalt. In some embodiments, the first layer comprises cobalt and the second capping layer comprises ruthenium. In some embodiments, the metal surface is a top surface of a copper filled via, wherein the via comprises a high aspect ratio and a hole of less than 20 nanometers.

Figure 4:
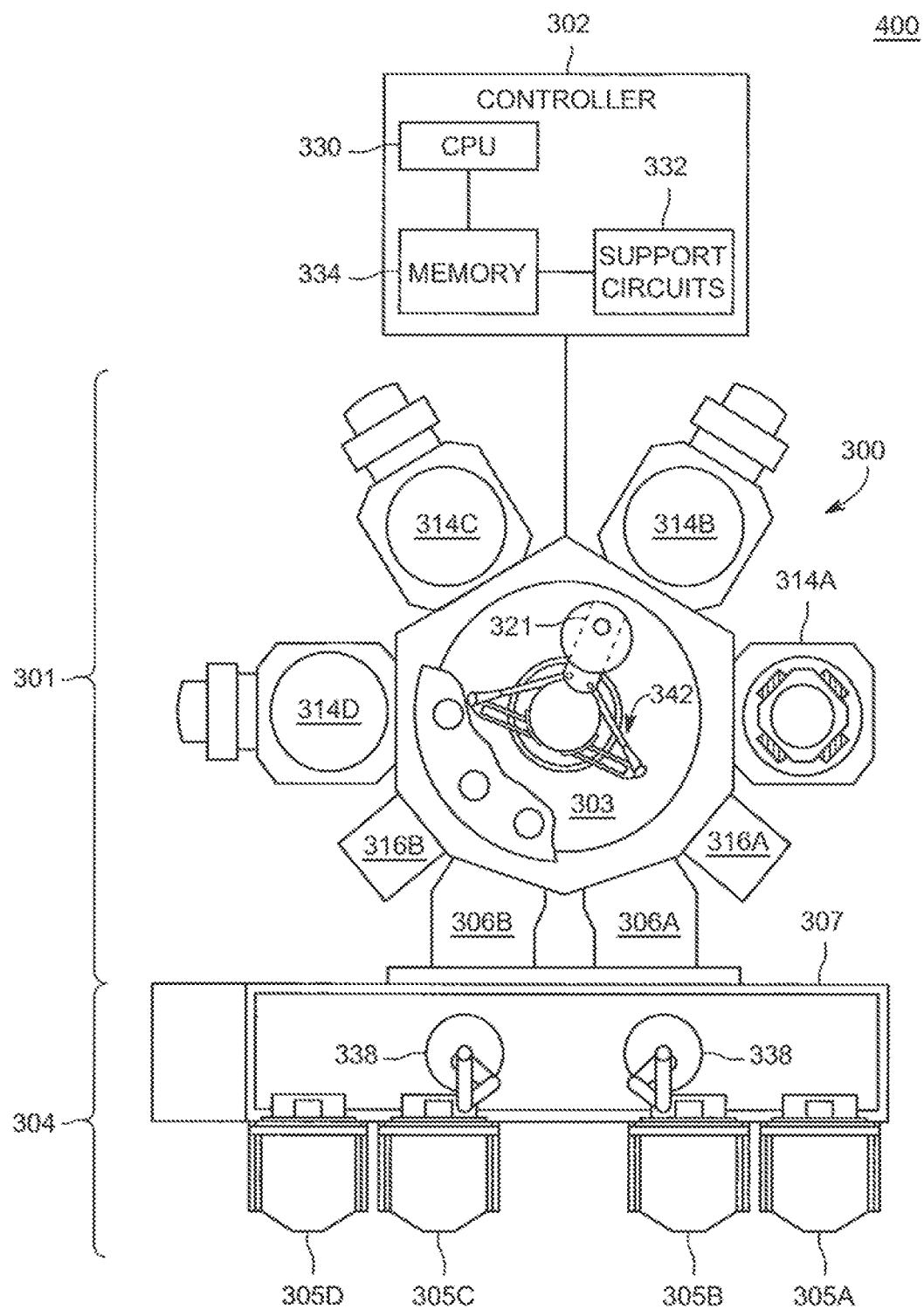
FIG. 4 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 400 (i.e., cluster tool) described below with respect to FIG. 4. Examples of the integrated tool 400 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps. For example, reduced vacuum breaks may limit or prevent contamination of the seed layer or other portions of the substrate.

The integrated tool 400 includes a processing platform 301 characterized as vacuum-tight, a factory interface 304, and a system controller 302. The processing platform 301 comprises multiple processing chambers, such as 314A, 314B, 314C, and 314D operatively coupled to a vacuum substrate transfer chamber (such as transfer chamber 303). The factory interface 304 is operatively coupled to the transfer chamber 303 by one or more load lock chambers (two load lock chambers, such as 306A and 306B shown in FIG. 4).

In some embodiments, the factory interface 304 comprises at least one docking station such as docking station 307, at least one factory interface robot such as factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 4. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed in the transfer chamber 303. The vacuum robot 342 is capable of transferring substrates 321 between the load lock chamber 306A and 306B and the processing chambers 314A, 314B, 314C, and 314D.

In some embodiments, the processing chambers 314A, 314B, 314C, and 314D, are coupled to the transfer chamber 303. The processing chambers 314A, 314B, 314C, and 314D comprise at least a chemical vapor deposition (CVD) chamber, and optionally, an annealing chamber. Additional chambers may also be provided such as additional CVD chambers and/or annealing chambers, a physical vapor deposition (PVD) chamber, or the like. CVD and annealing chambers may include any chambers suitable to perform all or portions of the methods described herein, as discussed above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 400 using a direct control of the process chambers 314A, 314B, 314C, and 314D or alternatively, by controlling the computers (or controllers) associated with the process chambers 314A, 314B, 314C, and 314D and the tool 400. In operation, the system controller 302 enables data collection and feedback from the respective chambers and systems to optimize performance of the tool 400. The system controller 302 generally includes a Central Processing Unit (CPU 330), a memory 334, and a support circuit 332. The CPU 330 may be one of any form of a general purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (such as system controller 302). The software routines may also be stored and/or executed by a second controller (not shown) that is located remotely from the tool 400. In embodiments, the cluster tool is configured for performing the methods of the present disclosure and process sequences included therein.

Referring back to FIG. 2F, in embodiments, the present disclosure includes an interconnect structure 270. For example, an interconnect structure 270 including a metal filled via such as via 231 disposed within a first dielectric layer 212 which may be a low-k dielectric layer, wherein a top surface 265 of the metal filled via is adjacent to a top surface of the dielectric surface 262 of a low-k dielectric layer; a first capping layer 250 is disposed or deposited atop the top surface of the metal filled via; and a second capping layer 251 is disposed or deposited atop a top surface of the first capping layer 250, wherein the first capping layer 250 and second capping layer 251 comprise ruthenium, cobalt, and combinations thereof, and wherein the first capping layer and second capping layer are different. In some embodiments, the metal filled via comprises copper. In embodiments, the metal filled via comprises copper deposited atop a liner within the metal filled via, wherein the liner comprises cobalt or ruthenium. In embodiments, the metal filled via is disposed within a low-k dielectric layer is a high aspect ratio via comprising a hole having a width between 5 to 20 nanometers.

Figure 6:
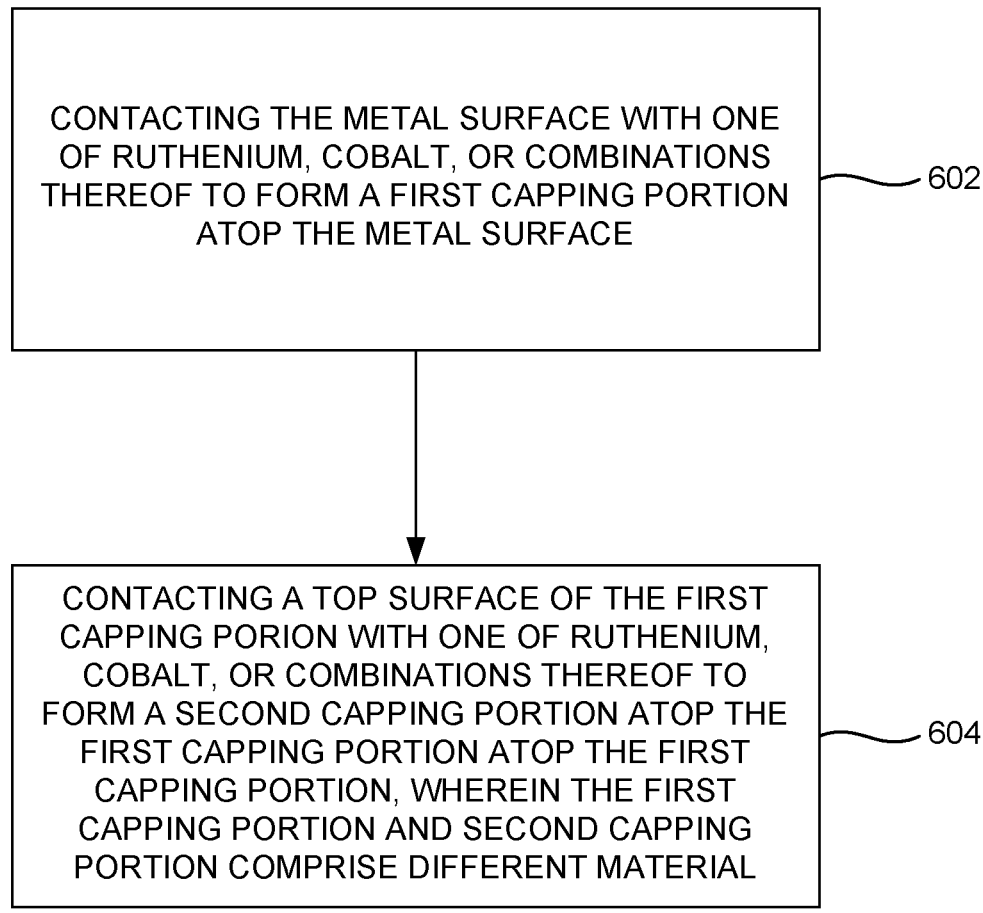
FIG. 6 depicts a flow chart of a method for forming an interconnect structure in accordance with some embodiments of the present disclosure.

Referring now to FIG. 6, in some embodiments, the present disclosure relates to a method 600 of selectively depositing a capping layer atop a substrate having a metal surface and a low-k dielectric surface, including: at 602, contacting the metal surface with one of ruthenium, cobalt, or combinations thereof to form a first capping portion atop the metal surface; and at 604, contacting a top surface of the first capping portion with one of ruthenium, cobalt, or combinations thereof to form a second capping portion atop the first capping portion, wherein the first capping portion and second capping portion comprise different material. In some embodiments, the low-k dielectric surface inhibits a deposition of ruthenium, cobalt, or combinations thereof thereon. In some embodiments, a plurality of capping portions are deposited atop the metal surface, wherein the plurality of metal portions include ruthenium, cobalt, or combinations thereof. In some embodiments, the metal surface is the top surface of a copper filled via.

Figure 5:
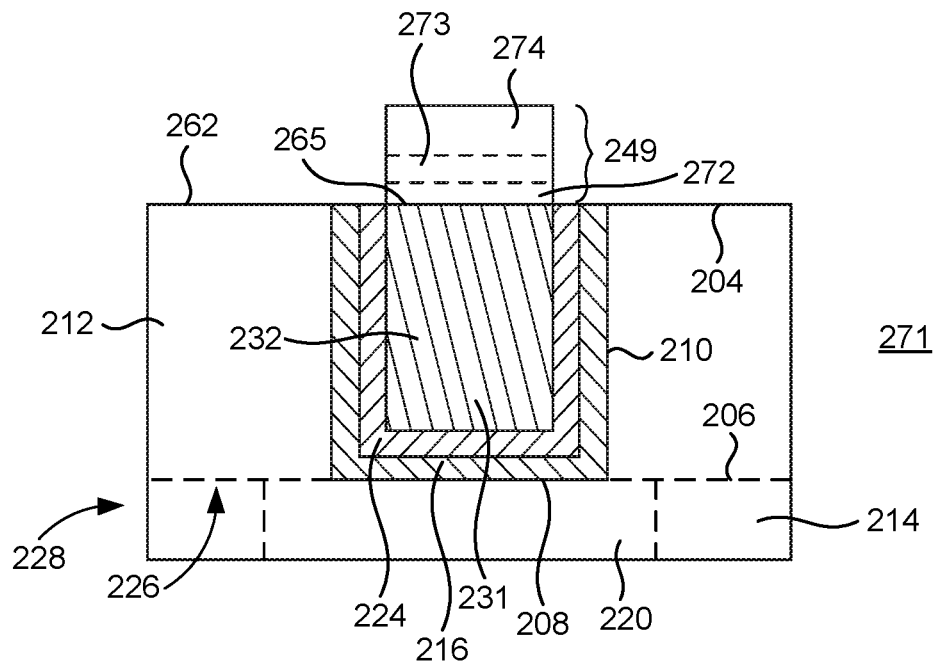
FIG. 5 depicts a side cross-sectional view of an interconnect structure formed in accordance with some embodiments of the present disclosure.

Referring now to FIG. 5, in embodiments, the present disclosure includes an interconnect structure 271. For example, an interconnect structure 271 including a metal filled via such as via 231 disposed within a first dielectric layer 212 which may be a low-k dielectric layer, wherein a top surface 265 of the metal filled via is adjacent to a top surface of the dielectric surface 262 of a low-k dielectric layer; a capping layer 249 including a first capping portion 272 is disposed or deposited atop the top surface of the metal filled via; and a second capping portion 273 is disposed or deposited atop a top surface of the first capping portion 272, wherein the first capping portion 272 and second capping portion 273 comprise ruthenium, cobalt, and combinations thereof, and wherein the first capping portion and second capping portion are different. In embodiments, a third capping portion 274 may be optionally included. For example, a third capping portion 274 may comprise ruthenium, cobalt, and combinations thereof, and the first capping portion, second capping portion, and third capping portion are different. In some embodiments, the metal filled via comprises copper. In embodiments, the metal filled via comprises copper deposited atop a liner within the metal filled via, wherein the liner comprises cobalt or ruthenium. In embodiments, the metal filled via is disposed within a low-k dielectric layer is a high aspect ratio via comprising a hole having a width between 5 to 20 nanometers.

In embodiments, capping layer 249 is formed atop the top surface of the metal filled via. In embodiments, the capping layer 249 includes at least one of ruthenium, cobalt, and combinations thereof. In embodiments, the capping layer 249 includes at least two of ruthenium, cobalt, and combinations thereof. In some embodiments, capping layer 249 may be a single layer having uniform or non-uniform composition through a thickness of the layer. In some embodiments, the capping layer 249 may be formed from multiple portions (such as first capping portion 272, second capping portion 273, and third capping portion 274 shown in phantom in FIG. 5 deposited atop each other. In embodiments, the second capping portion 273 may be a transitional region disposed between two portions. In embodiments, the second capping portion 273 may be a transitional region disposed between the first capping portion 272 and a third capping portion 274. In some embodiments, first capping portion 272 comprising predominantly ruthenium and a second capping portion comprises predominantly cobalt. Alternatively, in some embodiments, the capping layer 249 may comprise a first capping portion comprised predominantly of ruthenium and a second capping portion material comprising predominantly cobalt, wherein the materials are deposited throughout the thickness of the capping layer 249. For example, the first capping portion 272 may comprise about 10-50 percent, or more, of ruthenium proximate the metal layer and a second capping portion 273 may comprise substantially cobalt (e.g., about 50 percent or more) proximate an opposing surface of the first capping portion 272. Alternatively, in some embodiments, the capping layer 249 may comprise a first capping portion 272 and third capping portion 274 separated by a second capping portion 273, wherein the second capping portion 273 is a transitional layer. For example, in some embodiments, the first capping portion 272 may be predominantly ruthenium, and a second capping portion 273 may be a mixture of ruthenium and cobalt, and the third capping portion 274 may be predominantly cobalt.

In some embodiments, the capping layer 249 may have a graded concentration of material of ruthenium and cobalt throughout the layer. For example, one of the capping layer 249 materials may increase or decrease in concentration from the interface to the opposing surface of the capping layer 249. In addition, the capping layer 249 may have a first composition in a first portion of the capping layer 249 proximate the interface between the capping layer 249 and the substrate, a second composition in a second portion of the capping layer 249 between the first capping portion and a third capping portion as a transitional region disposed there between. In some embodiments, when moving from the first capping portion towards the second capping portion as a transitional region (e.g., away from the substrate), the concentration of one or more of the capping layer materials may decrease in concentration or increase in concentration. in some embodiments, the capping layer 249 may comprise a first capping portion 272 and third capping portion 274 separated by a second capping portion 273, wherein the second capping portion 273 is a transitional layer. For example, in some embodiments, the first capping portion 272 may be a combination of ruthenium and cobalt, however be predominantly ruthenium, and a second capping portion 273 may be a mixture of ruthenium and cobalt, and the third capping portion 274 may be a combination of cobalt and ruthenium, however be predominantly cobalt. In embodiments, the amount of ruthenium in the first capping portion 272 varies from the amount of ruthenium in the second capping portion 273 and the third capping portion 274, and the amount of cobalt in the first capping portion 272 varies from the amount of cobalt in the second capping portion 273 and third capping portion 274. In some embodiments where the substrate is simultaneously exposed to the cobalt precursor and the ruthenium precursor, the composition of the first capping portion 272, second capping portion 273, and third capping portion 274 may include cobalt-ruthenium and can be adjusted to form first capping portion, second capping portion, and third capping portion of different material compositions by adjusting the flow ratio of the precursors. For example, in some embodiments, the first capping portion 272 is a cobalt-ruthenium portion including less than about 50 percent cobalt, with the balance being ruthenium, a second capping portion 273 is a ruthenium-cobalt portion including about 50 percent cobalt and about 50 percent ruthenium, and a third capping portion 274 is a cobalt-ruthenium portion including less than about 50 percent ruthenium, with the balance being cobalt. In some embodiments, the ratio of cobalt precursor to ruthenium precursor provided to the processing chamber is about 2:1 to about 4:1.

In some embodiments, the capping layer 249 may be formed by CVD, ALD, or PVD processes. For example, a CVD process may be used to deposit any of the aforementioned embodiments of the capping layer 249 discussed above. For example, in some embodiments, the CVD process may comprise flowing a ruthenium-containing gas for a first period of time to deposit the capping layer 249 and then flowing one of a ruthenium-containing gas and/or a cobalt-containing gas for a second period of time to deposit another portion. In some embodiments, the flow of the ruthenium containing gas and the ruthenium-containing gas and/or the cobalt-containing gas may overlap for a third period of time, during which a transitional region of the capping layer 249 may be deposited. Each of the preceding steps may further comprise flowing a reducing agent along with the precursor gas. The reducing agent may comprise, for example, at least one of hydrogen (H2), ammonia (NH3), oxygen (O2), or hydrogen incorporated gases or the like.

In some embodiments, to achieve a graded concentration of the capping layer 249 and the during a co-flow process sequence of precursors, a ratio of the ruthenium-containing gas and the cobalt-containing gas may be decreased between a beginning and an end of a third period of time. For example, the ratio may be decreased in steps, for example, wherein each step comprises tuning the ratio at a desired value and flowing at that value for a portion of a third period of time. Alternatively, the ratio may be decreased continuously between the beginning and the end of the second period of time. For example, upon or after beginning the flow of the ruthenium-containing gas or the cobalt-containing gas, the flow of the ruthenium-containing gas may be reduced until it is stopped. In addition, the flow of the ruthenium-containing gas or the cobalt-containing gas may be kept constant or may be increased during a third period of time.

In some embodiments, for example in an ALD process, a reducing agent, as discussed above, may be flowed simultaneously with or alternately with the flow of the ruthenium-containing gas and the cobalt containing gas. In addition, the flows of the respective gases may be alternated with a purge gas flow, such that there is a period of deposition followed by a purge of the chamber to define a deposition cycle, and the deposition cycle is repeated as desired to deposit a desired thickness of material to form the capping layer 249.

In some embodiments, the deposition cycle may be maintained or may be varied throughout multiple deposition steps to obtain a film composition through the capping layer 249 in any of the desired embodiments as discussed above. For example, the deposition cycle may be uniform to deposit a capping layer 249 having a substantially uniform composition throughout. Alternatively, the deposition cycle may be varied to deposit a capping layer 249 having a desired composition of ruthenium and/or cobalt in various locations throughout the capping layer 249, as described above.

In some embodiments, and referring now to FIG. 5, the present disclosure relates to an interconnect structure, including: a metal filled via 231 disposed within a low-k dielectric layer such as dielectric layer 212, wherein a top surface 265 of the metal filled via is adjacent to a top surface of the low-k dielectric layer; a capping layer 249 comprising a first capping portion 272 deposited atop the top surface of the metal filled via, and a second capping portion 273 deposited atop a top surface of the first capping portion 272, wherein the first capping portion 272 and second capping portion 273 comprise ruthenium, cobalt, and combinations thereof, and wherein the first capping portion 272 and second capping portion 273 are different. In embodiments, an additional capping portion may optionally be disposed between the first capping portion and second capping portion. In embodiments, the interconnect structure includes a metal filled via, such as a copper filled via. In embodiments, the metal filled via includes a copper deposited atop a liner within the metal filled via, wherein the liner comprises cobalt or ruthenium. In some embodiments, the metal filled via disposed within a low-k dielectric layer is a high aspect ratio via including a hole having a width between 5 to 20 nanometers.

While the foregoing is directed to embodiments of the present disclosure, other and further embodiments of the disclosure may be devised without departing from the basic scope thereof.

The invention claimed is:

1. A method of forming an interconnect structure, the method comprising:
    selectively depositing two or more capping layers atop a top surface of a via within a low-k dielectric layer, wherein the two or more capping layers comprise a first layer of ruthenium and a second layer of cobalt.

2. The method of claim 1, wherein the via comprises a copper metal fill material.

3. The method of claim 1, wherein the via comprises a copper metal fill material deposited atop a liner layer.

4. The method of claim 1, wherein the via comprises a copper metal fill material deposited atop a liner layer, wherein the liner layer comprises ruthenium, cobalt, and combinations thereof.

5. The method of claim 1, wherein the via comprises a copper metal fill material deposited atop a liner layer, and wherein the liner layer is deposited atop a barrier layer.

6. The method of claim 1, wherein the two or more capping layers each have a thickness of 5 to 20 angstroms.

7. The method of claim 1, wherein the first layer of ruthenium is directly atop the top surface of the via, and the second layer of cobalt is directly atop a top surface of the first layer of ruthenium.

8. The method of claim 1, wherein the second layer of cobalt is directly atop the top surface of the via, and the first layer of ruthenium is directly atop a top layer of the second layer of cobalt.

9. A method of selectively depositing a capping layer atop a substrate having a metal surface and a low-k dielectric surface, comprising:
    contacting the metal surface with one of ruthenium, cobalt, or combinations thereof to selectively deposit and form a first capping portion atop the metal surface, wherein a top surface of the metal surface is adjacent to a top surface of the low-k dielectric surface; and
    contacting a top surface of the first capping portion with one of ruthenium, cobalt, or combinations thereof to selectively deposit and form a second capping portion atop the first capping portion, wherein the first capping portion and second capping portion comprise different material.

10. The method of claim 9, wherein the low-k dielectric surface inhibits a deposition of ruthenium, cobalt, or combinations thereof thereon.

11. The method of claim 9, wherein the metal surface is the top surface of a copper filled via.

12. The method of claim 11, wherein the copper filled via comprises a liner layer, wherein the liner layer comprises ruthenium, cobalt, and combinations thereof.

13. The method of claim 9, wherein the first capping portion and second capping portion each have a thickness of 5 to 20 angstroms.

14. The method of claim 9, wherein the first capping portion comprises ruthenium and the second capping portion comprises cobalt.

15. The method of claim 9, wherein the first capping portion comprises cobalt and the second capping portion comprises ruthenium.

16. The method of claim 9, wherein the metal surface is a top surface of a copper filled via, wherein the via comprises a high aspect ratio and a hole of less than 20 nanometers.

* * * * *